United States Patent
Nuttgens

(10) Patent No.: US 10,778,207 B1
(45) Date of Patent: Sep. 15, 2020

(54) PASSIVE DYNAMIC BIASING FOR MOSFET CASCODE

(71) Applicant: Semtech Corporation, Camarillo, CA (US)

(72) Inventor: Jonah Edward Nuttgens, Southampton (GB)

(73) Assignee: Semtech Corporation, Camarillo, CA (US)

(*) Notice: Subject to any disclaimer, the term of this patent is extended or adjusted under 35 U.S.C. 154(b) by 0 days.

(21) Appl. No.: 16/401,812

(22) Filed: May 2, 2019

(51) Int. Cl.
  *H03K 17/041* (2006.01)
  *H04B 10/50* (2013.01)
  *H01S 5/042* (2006.01)

(52) U.S. Cl.
  CPC ..... *H03K 17/04106* (2013.01); *H01S 5/0427* (2013.01); *H04B 10/50* (2013.01)

(58) Field of Classification Search
  CPC . H03K 17/04; H03K 17/041; H03K 17/04106
  See application file for complete search history.

(56) References Cited

U.S. PATENT DOCUMENTS

| 10,078,343 | B2 * | 9/2018 | Takada ............ H03K 17/04106 |
| 2005/0083563 | A1 | 4/2005 | Tsai |
| 2019/0245624 | A1 | 8/2019 | Kishi et al. |

FOREIGN PATENT DOCUMENTS

WO    2018074410 A1    10/2017

\* cited by examiner

*Primary Examiner* — Hai L Nguyen
(74) *Attorney, Agent, or Firm* — Robert D. Atkins; Patent Law Group: Atkins and Associates, P.C.

(57) ABSTRACT

A driver circuit has a plurality of transistors in a cascode arrangement. A passive biasing circuit is coupled to a gate terminal of a first transistor of the plurality of transistors. The passive biasing circuit has a first resistor coupled to a circuit node to provide a first biasing signal, a first capacitor coupled between the circuit node and a power supply conductor, a second resistor coupled between the circuit node and a drain terminal of the first transistor, and a third resistor coupled between the circuit node and a source terminal of the first transistor. A second transistor has a gate terminal coupled for receiving a data signal which controls an optical device.

17 Claims, 4 Drawing Sheets

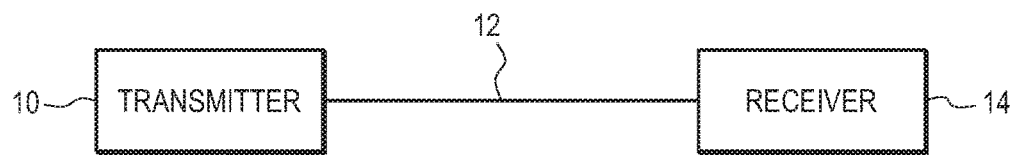
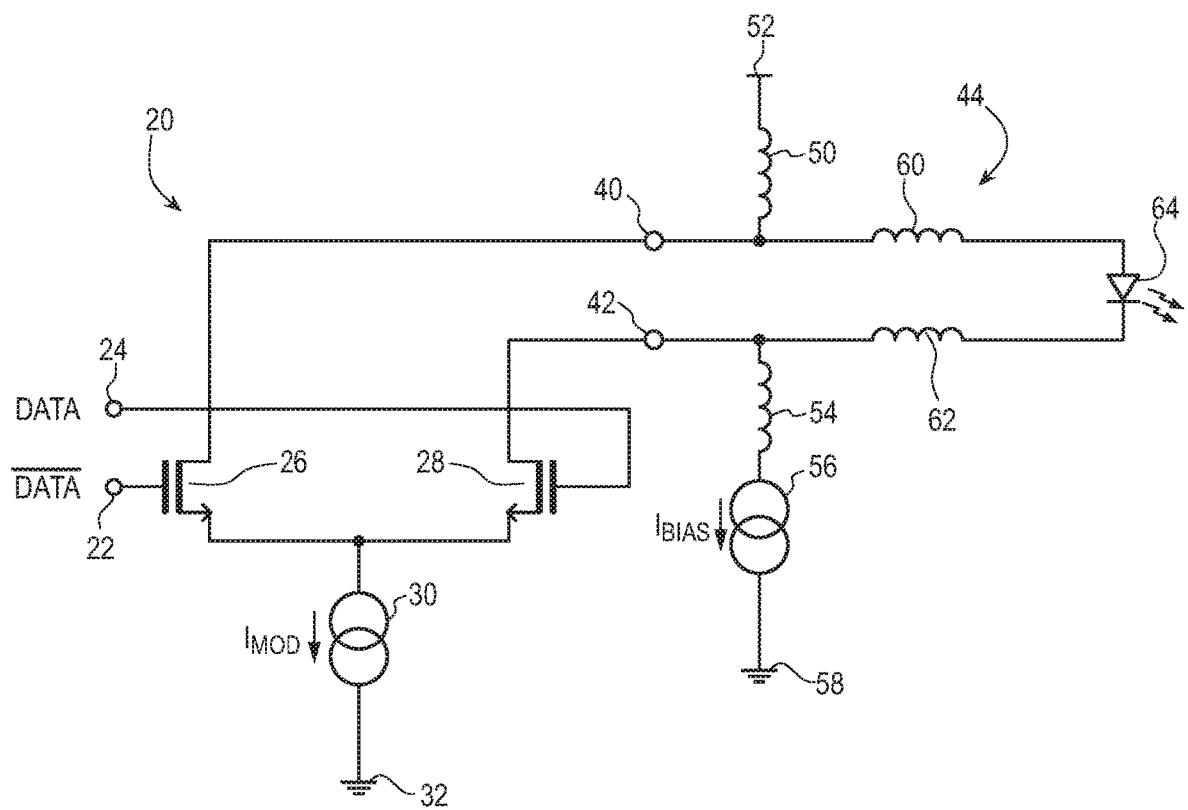
FIG. 1
FIG. 2

PASSIVE DYNAMIC BIASING FOR MOSFET CASCODE

FIELD OF THE INVENTION

The present invention relates in general to a driver circuit and, more particularly, to a passive dynamic biasing circuit for cascoded MOSFETs.

BACKGROUND OF THE INVENTION

A driver circuit is commonly used to provide current or voltage to induce functionality in an actuator or transmitting device. For example, a laser driver circuit can be used to control the transmission of light from the laser diode. Optical communication involves the transmission of information from one place to another by sending a modulated light source, typically through an optical fiber cable. A laser diode is commonly used to transmit data in digital form over a telecommunications network. The light forms a carrier wave that is modulated to carry information. The laser diode requires high voltage swings from the driver circuit.

The laser driver may use metal oxide semiconductor field effect transistors (MOSFET) or complementary metal oxide semiconductor (CMOS) in a cascode arrangement to handle the high voltage swings. The source of a higher cascode MOSFET is connected to the drain of a lower cascode MOSFET, with substantially the same current flowing through both MOSFETs. In a differential configuration, the driver circuit has complementary outputs with a constant current ($I_{MOD}$) steered alternatively between the two outputs in response to a differential data signal. The modulation current $I_{MOD}$ can be relatively large, up to 100 mA or more. Switching speeds for a gigabit driver circuit must be fast, e.g., tens of picoseconds. Therefore, the rate of change of current at the driver outputs (dI/dt) is very large during current switching transitions.

The DC resistance of the laser diode is typically small, often less than 10 ohms. However, the physical wiring between the driver and laser diode tends to have a parasitic inductive component $L_p$, which increases the effective impedance of the load at high frequencies and causes large peak transient voltage spikes at the driver output ($V=L_p*dI/dt$) during current switching transitions. The magnitude of the voltage spikes may damage, shorten the life, or otherwise adversely affect reliability of the MOSFETs.

In the prior art, MOSFETs have been implemented with a thick gate oxide to tolerate the high voltage spikes. However, a thick oxide MOSFET is inherently slower than small-geometry, thin-oxide MOSFETs due to longer minimum channel length, larger width to length ratio to achieve a given transconductance, and higher capacitance that must be charged and discharged each cycle of operation. The thick gate oxide MOSFETs are often unsatisfactory for high speed applications.

BRIEF DESCRIPTION OF THE DRAWINGS

FIG. 1 illustrates functional blocks for optical data transmission;

FIG. 2 illustrates a differential driver circuit for an optical transmitter;

DETAILED DESCRIPTION OF THE DRAWINGS

Figure 3:
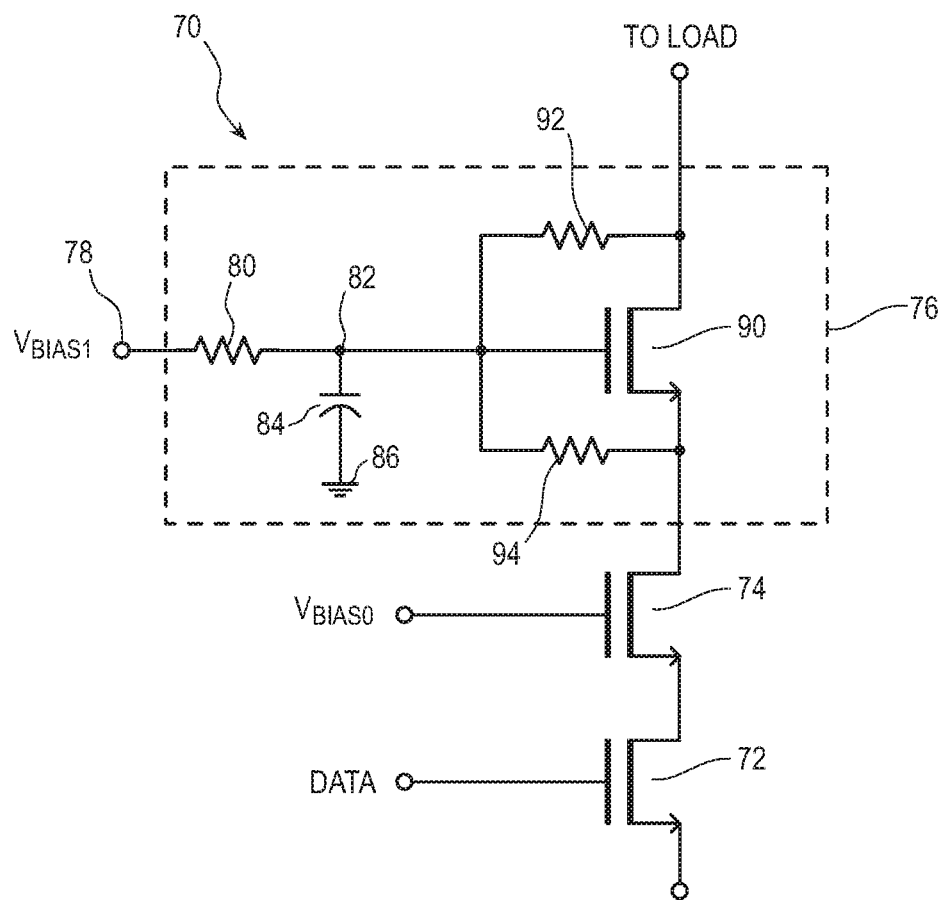
FIG. 3 illustrates a simplified driver circuit including a passive biasing cell for cascoded MOSFETs.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

FIG. 1 illustrates optical data transmitter 10 transmitting light along fiber optical cable 12 to optical data receiver 14. Optical transmitter 10 uses a laser diode driver circuit to modulate a light-emitting diode (LED), vertical-cavity surface-emitting laser (VCSEL), or laser diode in accordance with the transmitted data to generate the data carrying light signal.

FIG. 2 illustrates a simplified, conceptual laser diode driver circuit 20 in optical transmitter 10. Driver circuit 20 is applicable to other types of loads. Driver circuit 20 receives a differential signal DATA and its complement at terminals 22 and 24, respectively, to be modulated into the light signal for transmission. The gate of transistor 26 is coupled to terminal 22, and the gate of transistor 28 is coupled to terminal 24. The sources of transistors 26 and 28 are commonly coupled to current source 30 referenced to power supply conductor 32 operating at ground potential. Current source 30 conducts modulation current $I_{MOD}$. When DATA is greater than the complement of DATA, then transistor 28 conducts modulation current $I_{MOD}$. When DATA is less than the complement of DATA, then transistor 26 conducts modulation current $I_{MOD}$. Terminals 40 and 42 are the laser driver circuit output terminals to optical load circuit 44. RF isolation choke 50 is coupled between terminal 40 and power supply conductor 52 operating at a positive potential. RF isolation choke 54 is coupled between terminal 42 and current source 56 referenced to power supply conductor 58 operating at ground potential. Current source 56 conducts bias current $I_{BIAS}$. Inductors 60 and 62 are parasitic wiring inductance. Laser diode 64 transmits light according to the data signals.

FIG. 3 illustrates a more detailed portion of laser diode driver circuit 20 in optical transmitter 10, connected in substitution for transistors 26 and 28. Cascode circuit 70 receives one of the DATA signals at the gate of transistor 72. Transistor 74 is cascoded with transistor 72, i.e., the source of transistor 74 is coupled to the drain of transistor 72. The gate of transistor 74 receive bias signal $V_{BIAS0}$. In a cascode arrangement, substantially the same current flows through each cascoded transistor. Therefore, the cascode circuit behaves very similarly to a single transistor, but the topmost drain terminal is able to tolerate a much larger voltage swing.

As a feature of cascode circuit 70, passive biasing cell 76 receives bias signal $V_{BIAS1}$ at terminal 78. Resistor 80 is coupled between terminal 78 and node 82. Capacitor 84 is coupled between node 82 and power supply conductor 86.

The gate of transistor 90 is coupled to node 82. Resistor 92 is coupled between the drain of transistor 90 and node 82, and resistor 94 is coupled between the source of transistor 90 and node 82. As described below, passive biasing cell 76 allows cascoded MOSFETs to tolerate larger transient voltage swing than conventional cascoded transistor structure.

Figure 4:
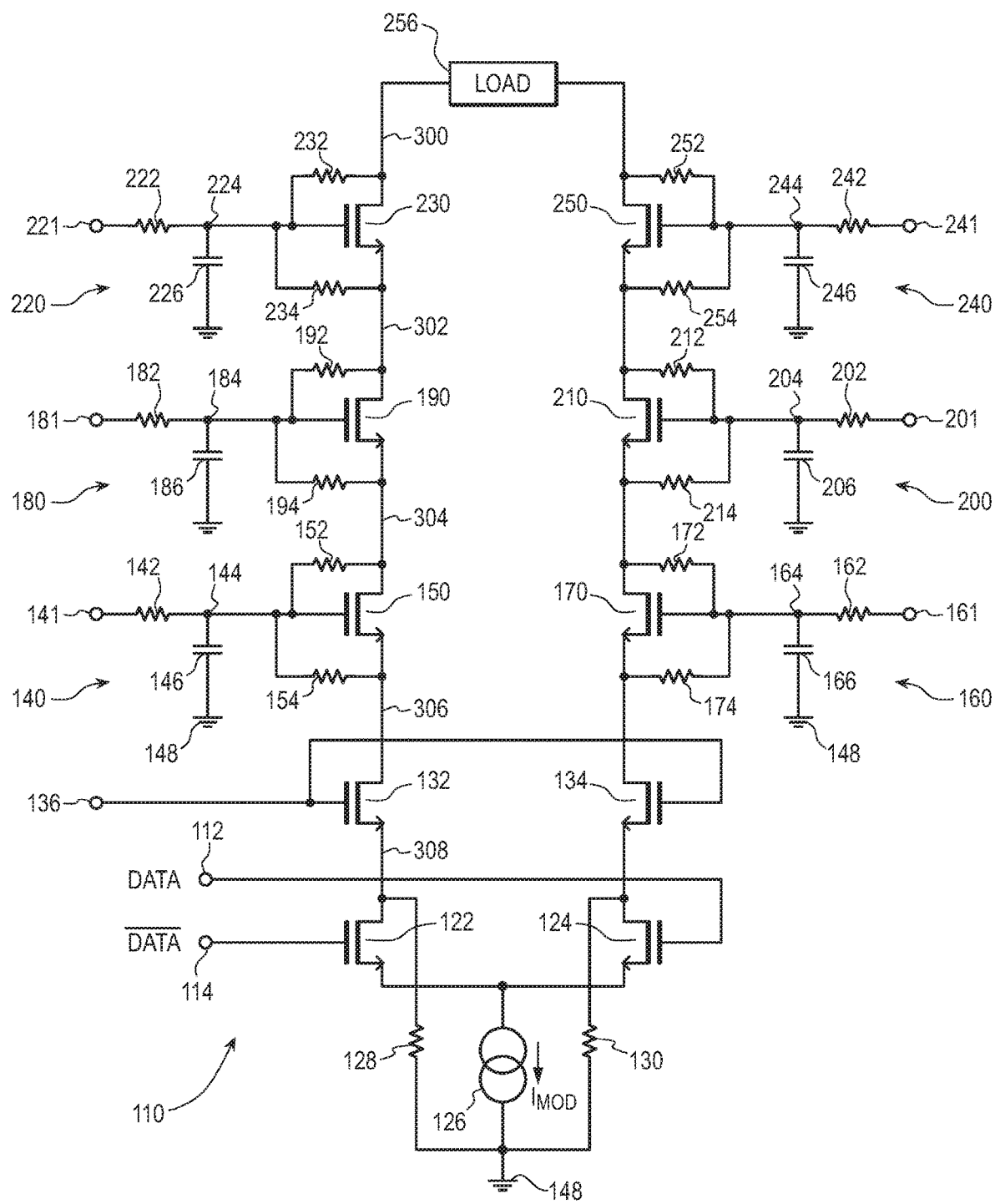
FIG. 4 illustrates a differential driver circuit including passive biasing cells for cascoded MOSFETs.

FIG. 4 illustrates a laser diode driver circuit 110 in optical transmitter 10. Driver circuit 110 is applicable to other types of loads. Driver circuit 110 receives a differential signal DATA and its complement at terminals 112 and 114, respectively, to be modulated into the light signal for transmission. The gate of transistor 122 is coupled to terminal 114, and the gate of transistor 124 is coupled to terminal 112. The sources of transistors 122 and 124 are commonly coupled to current source 126 referenced to power supply conductor 148 operating at ground potential. Current source 126 conducts modulation current $I_{MOD}$. When DATA is greater than the complement of DATA, then transistor 124 conducts modulation current $I_{MOD}$. When DATA is less than the complement of DATA, then transistor 122 conducts modulation current $I_{MOD}$. Resistor 128 is coupled between the drain of transistor 122 and power supply conductor 148, and resistor 130 is coupled between the drain of transistor 124 and power supply conductor 148. Resistors 128 and 130 conduct a quiescent current, maintaining the biasing of the cascode transistors when either of transistors 122 or 124 are not conducting.

Transistor 132 is cascoded with transistor 122, i.e., the source of transistor 132 is coupled to the drain of transistor 122. Transistor 134 is cascoded with transistor 124, i.e., the source of transistor 134 is coupled to the drain of transistor 124. The gates of transistors 132 and 134 receive bias signal $V_{BIAS1}$ at terminal 136. In a cascode arrangement, substantially the same current flows through each cascoded transistor.

Laser diode driver circuit 110 includes a plurality of similar passive dynamic biasing cells or circuits. For example, biasing cell 140 receives bias signal $V_{BIAS2}$ at terminal 141. Resistor 142 is coupled between terminal 141 and node 144. Capacitor 146 is coupled between node 144 and power supply conductor 148. Transistor 150 is cascoded with transistor 132, i.e., the source of transistor 150 is coupled to the drain of transistor 132 so that each transistor conducts substantially the same current. The gate of transistor 150 is coupled to node 144. Resistor 152 is coupled between the drain of transistor 150 and node 144, and resistor 154 is coupled between the source of transistor 150 and node 144. Biasing cell 160 receives bias signal $V_{BIAS2}$ at terminal 161. Resistor 162 is coupled between terminal 161 and node 164. Capacitor 166 is coupled between node 164 and power supply conductor 148. Transistor 170 is cascoded with transistor 134, i.e., the source of transistor 170 is coupled to the drain of transistor 134 so that each transistor conducts substantially the same current. The gate of transistor 170 is coupled to node 164. Resistor 172 is coupled between the drain of transistor 170 and node 164, and resistor 174 is coupled between the source of transistor 170 and node 164.

Biasing cell 180 receives bias signal $V_{BIAS3}$ at terminal 181. Resistor 182 is coupled between terminal 181 and node 184. Capacitor 186 is coupled between node 184 and power supply conductor 148. Transistor 190 is cascoded with transistor 150, i.e., the source of transistor 190 is coupled to the drain of transistor 150 so that each transistor conducts substantially the same current. The gate of transistor 190 is coupled to node 184. Resistor 192 is coupled between the drain of transistor 190 and node 184, and resistor 194 is coupled between the source of transistor 190 and node 184. Biasing cell 200 receives bias signal $V_{BIAS3}$ at terminal 201. Resistor 202 is coupled between terminal 201 and node 204. Capacitor 206 is coupled between node 204 and power supply conductor 148. Transistor 210 is cascoded with transistor 170, i.e., the source of transistor 210 is coupled to the drain of transistor 170 so that each transistor conducts substantially the same current. The gate of transistor 210 is coupled to node 204. Resistor 212 is coupled between the drain of transistor 210 and node 204, and resistor 214 is coupled between the source of transistor 210 and node 204.

Biasing cell 220 receives bias signal $V_{BIAS4}$ at terminal 221. Resistor 222 is coupled between terminal 221 and node 224. Capacitor 226 is coupled between node 224 and power supply conductor 148. Transistor 230 is cascoded with transistor 190, i.e., the source of transistor 230 is coupled to the drain of transistor 190 so that each transistor conducts substantially the same current. The gate of transistor 230 is coupled to node 224. Resistor 232 is coupled between the drain of transistor 230 and node 224, and resistor 234 is coupled between the source of transistor 230 and node 224. Biasing cell 240 receives bias signal $V_{BIAS4}$ at terminal 241. Resistor 242 is coupled between terminal 241 and node 244. Capacitor 246 is coupled between node 244 and power supply conductor 148. Transistor 250 is cascoded with transistor 210, i.e., the source of transistor 250 is coupled to the drain of transistor 210 so that each transistor conducts substantially the same current. The gate of transistor 250 is coupled to node 244. Resistor 252 is coupled between the drain of transistor 250 and node 244, and resistor 254 is coupled between the source of transistor 250 and node 244.

Transistors 122, 132, 150, 190, and 230 are cascoded in one differential path and conduct a first cascode current, and transistors 124, 134, 170, 210, and 250 are cascoded in the other differential path and conduct a second cascode current in response to DATA and its complement. Transistors 122, 124, 132, 134, 150, 170, 190, 210, 230, and 250 (122-250) are each small geometry, thin gate oxide, low voltage MOSFETs or CMOS devices. Transistors 122-250 can be implemented as n-channel or p-channel type devices. Transistors 122-250 exhibit low capacitance and fast switching times. Additional biasing cells and cascoded MOSFETs can accommodate even larger voltage swings.

Figure 5:
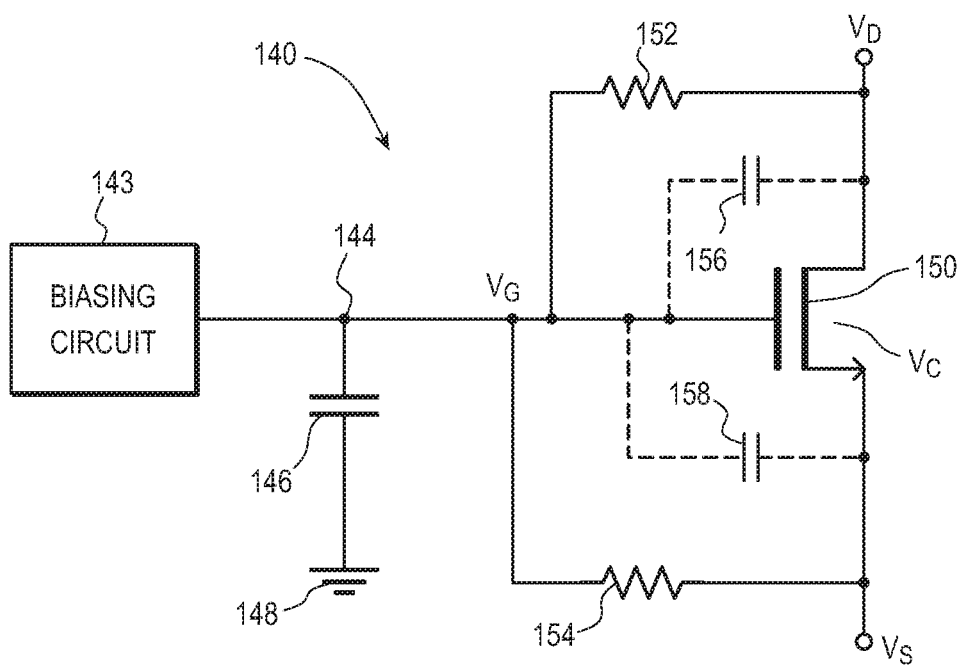
FIG. 5 illustrates further detail of the passive biasing cell with a biasing circuit providing the biasing signal.

FIG. 5 illustrates further detail of one passive dynamic biasing cell 140. Biasing cells 160, 180, 200, 220, and 240 follow a similar structure and analysis. MOSFET 150 further includes inherent gate-drain capacitor 156 and gate-source capacitor 158. Biasing circuit 143 provides the DC biasing signal to node 144. Capacitor 146 ($C_{146}$), intrinsic capacitance 156 ($C_{156}$) and intrinsic capacitance 158 ($C_{158}$) form a capacitive potential divider for AC components of the cascode gate signal. Likewise, resistor 152 ($R_{152}$), and resistor 154 ($R_{154}$), in conjunction with the output resistance of biasing circuit 143, form a resistive potential divider for DC components of the cascade gate signal. Notably, resistor 152 is in parallel with capacitor 156, resistor 154 is in parallel with capacitor 158, and the output resistance of biasing circuit 143 is effectively in parallel with capacitor 146.

Figure 6A:
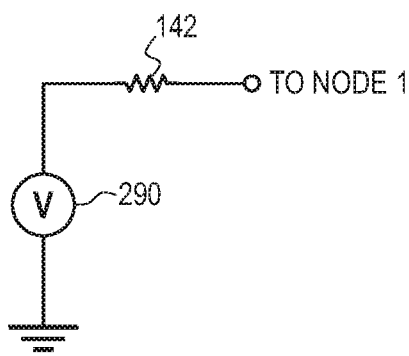
FIGS. 6a-6b illustrate alternate embodiments of the biasing circuit.
Figure 6B:
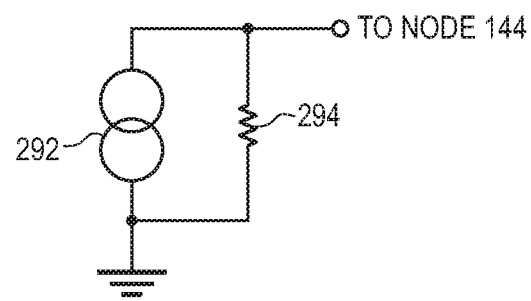

Biasing circuit 143 can include voltage source 290 and resistor 142 as shown in FIG. 6a, or current source 292 is coupled in parallel with resistor 294, as shown in FIG. 6b. Biasing circuit 143 may also be implemented using any combination of voltage sources, current sources and resistors, that provide an output equivalent to a Thevenin voltage source with series resistance. Components providing a similar function are assigned the same reference numbers as FIG. 5. Biasing cells 160, 180, 200, 220, and 240 can use the embodiments of FIG. 5.

Passive biasing cell 140 provides a dynamic bias voltage to the gate of transistor 140. A virtual channel $V_C$ represents the net effective voltage for the channel of transistor 150, i.e., $V_C$ is a weighted average of the drain voltage $V_D$ and source voltage $V_S$, in proportion to the ratio of $C_{156}$ to $C_{158}$. In contrast with a conventional cascode design where the gate voltage is held constant, the cascode gate voltage $V_G$ at node 144 varies in response to the changing conditions of device current and drain and source voltages. The components of biasing cell 140, together with $C_{156}$ and $C_{158}$, form a potential divider which determines the cascode gate voltage $V_G$ as a function of drain voltage $V_D$ and source voltage $V_S$. The dynamic variation of the cascode gate voltage enables transistor 150 to tolerate a wider swing on its drain voltage than a conventional cascode transistor, before exceeding tolerances of the drain-source voltage $V_{DS}$, gate-source voltage $V_{GS}$, and gate-drain voltage $V_{GD}$, since $V_G$ partially tracks voltage variations on $V_D$ and $V_S$).

Given the virtual channel voltage $V_C$ for transistor 150, then $C_{156}$ and $C_{is}$g can be combined into a single effective gate capacitance $C_G = C_{156} + C_{158}$. The bulk terminal of transistor 150 may be connected to its source, using deep N-well where necessary, to allow gate-bulk capacitance to be accounted for in $C_{158}$. Alternatively, the bulk terminal of transistor 150 is grounded, and gate-bulk capacitance would contribute to $C_{146}$. The variation of gate voltage with channel voltage, $dV_G/dV_C$, at high frequencies is then determined by the potential divider ratio $dV_G/dV_C \approx C_G/(C_G + C_{146})$. If the values of $R_{154}$ and $R_{152}$ are in the same proportion as $C_{156}$ and $C_{158}$, then the $V_C$ approximation applies at low frequencies for small signals, where $dV_G/dV_C \approx R_{142}/(R_{142} + (R_{152}//R_{154}))$ and "$R_{152}//R_{154}$" is a parallel combination of $R_{152}$ and $R_{154}$. If $R_{142} * C_{146} = (R_{152}//R_{154}) * C_G$, then the entire divider ratio $dV_G/dV_C$ becomes independent of frequency. Notably, the ratio of $C_{156}$ to $C_{158}$ varies with operating conditions of transistor 150, particularly when the device enters the triode region. The $V_C$ approximation becomes more frequency-dependent, but with little effect on overall circuit operation. A value for the ratio of $R_{154}$ to $R_{152}$, is selected as the average value of the $C_{156}$ to $C_{158}$ ratio in saturation region of transistor 150.

In selecting value of the components of passive dynamic biasing cell 140, the nominal potential divider ratio, $C_G/(C_G + C_{146})$, can be chosen to determine the amount of voltage swing at node 144 of transistor 150, and therefore also its source since the transistor behaves as a source-follower. The greater the potential divider ratio, the greater the tolerance to drain voltage swing, but also more of the voltage swing is passed along to its source. If the total voltage swing on the driver output is large, then multiple transistors like 150 ("cascodes") can be stacked to progressively reduce the voltage swing at each intermediate node along the chain by progressively decreasing the potential divider ratio of each successive cascode.

In one embodiment, $C_{146} = C_{166} = C_G * 3$, $C_{186} = C_{206} = C_G$, and $C_{226} = C_{246} = C_G/3$. The capacitive potential divider ratio for biasing cells 220 and 240 is 0.75, the capacitive potential divider ratio for biasing cells 180 and 200 is 0.50, and the capacitive potential divider ratio for biasing cells 140 and 160 is 0.25. Drain and source resistors are the same for each biasing cell, i.e., $R_{152} = R_{172} = R_{192} = R_{212} = R_{232} = R_{252}$, and $R_{154} = R_{174} = R_{194} = R_{214} = R_{234} = R_{254}$. The resistor potential divider ratios are the same as the capacitor potential divider ratios.

Given that MOSFET is a non-linear device, gate voltage $V_G$ at node 144 incrementally changes with $V_D$ and $V_S$. The voltage source $V_{BIASn}$ determines the absolute DC voltages of the MOS terminals and is selected to ensure that $V_{DS}$, $V_{GS}$, and $V_{GD}$ of each cascode stay within safe limits over the full operating range of the circuit. Given each MOSFET tolerating 1.0 volt, $V_{BIAS1} = 1.0 + V_{TH}$, and $V_{BIAS1} - V_{BIAS3}$ are chosen such that node $144 = 2.0 + V_{TH}$, node $184 = 3.0 + V_{TH}$, and node $224 = 4.0 + V_{TH}$ when the topmost cascode drain voltage is 5.0V, where $V_{TH}$ is the threshold voltage of the cascode transistors. In the case that either 122 or 124 may be fully switched off, a small quiescent current should flow through resistors 128 and 130 into the cascode stack to prevent the current from falling to zero, which reduces the change in $V_{GS}$ of the cascodes between the "on" and "off" states and provides additional headroom in the driver circuit.

In driver circuit 110, multiple cascoded transistors 132, 150, 190, 230, and 134, 170, 210, 250, (132-250) are stacked in series to tolerate high peak voltages. Passive biasing cells 140, 160, 180, 200, 220, and 240, (140-240) each with a progressively larger gate bias and potential divider ratio, enable the high-speed, high-voltage tolerant driver circuit 110, with minimal effective output capacitance.

Figure 7:
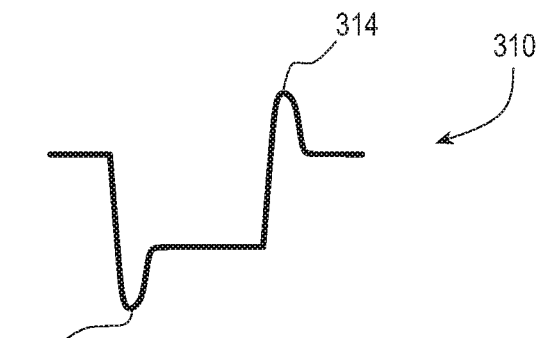
FIG. 7 illustrates a waveform plot of the voltage swing along the cascoded MOSFETs.

FIG. 7 illustrates a waveform 310 at node 300 in FIG. 4. Peaks 312 and 314 occur with the parasitic inductances at the transitions of waveform 310. The waveform plot at node 302 will be the same shape and smaller in amplitude than node 300, e.g., providing 1.0 volts across transistor 230, which is within its tolerance. The waveform plot at node 304 will be the same shape and smaller in amplitude than node 302, e.g., providing 1.0 volts across transistor 190, which is within its tolerance. The waveform plot at node 306 will be the same shape and smaller in amplitude than node 304, e.g., providing 1.0 volts across transistor 150, which is within its tolerance. The waveform plot at node 308 will be the same shape and smaller in amplitude than node 306, e.g., providing 1.0 volts across transistor 132, which is within its tolerance. The large, high-speed voltage transients on the driver output are distributed evenly along cascode MOSFET stack 132-250 and 140-240, with the voltage between the terminals of each individual FET kept within safe limits.

In summary, the passive biasing cell allows cascoded MOSFETs to tolerate larger transient voltage swing than conventional cascoded transistor structure. The MOSFETs can be fast, small-geometry, low-voltage transistors, while collectively providing a high-voltage tolerance at the output of the driver circuit by nature of the stacked arrangement sharing a high voltage drop, with a high bandwidth and switching speed. The passive biasing cell requires minimal additional power consumption and has application to high-speed CMOS driver ICs, including laser drivers for optical transmitters. The driver circuit with passive biasing cells and cascoded MOSFETs is applicable to other types of loads.

While one or more embodiments of the present invention have been illustrated in detail, the skilled artisan will appreciate that modifications and adaptations to those embodiments may be made without departing from the scope of the present invention as set forth in the following claims.

What is claimed:
1. A driver circuit, comprising:
a plurality of transistors of a same conductivity type coupled in a cascode arrangement; and
a first passive biasing circuit coupled to a gate terminal of a first transistor of the plurality of transistors, the first passive biasing circuit including,

(a) a biasing circuit coupled to a circuit node to provide a first biasing signal to the gate terminal of the first transistor,
(b) a first capacitor coupled between the circuit node and a power supply conductor,
(c) a first resistor coupled between the circuit node and a drain terminal of the first transistor, and
(d) a second resistor coupled between the circuit node and a source terminal of the first transistor.

2. The driver circuit of claim 1, further including:
a second passive biasing cell providing a second biasing signal; and
a second transistor of the plurality of transistors comprising a gate terminal coupled for receiving the second biasing signal.

3. The driver circuit of claim 1, further including a second transistor of the plurality of transistors comprising a gate terminal coupled for receiving a data signal.

4. The driver circuit of claim 1, further including a second transistor of the plurality of transistors comprising a gate terminal coupled for receiving a second biasing signal.

5. The driver circuit of claim 1, wherein the biasing circuit includes:
a voltage source; and
a third resistor coupled between the voltage source and the circuit node.

6. A driver circuit, comprising:
a plurality of transistors in a cascode arrangement; and
a first passive biasing circuit coupled to a gate terminal of a first transistor of the plurality of transistors, the first passive biasing circuit including,
(a) a biasing circuit coupled to a circuit node to provide a first biasing signal to the gate terminal of the first transistor,
(b) a first capacitor coupled between the circuit node and a power supply conductor,
(c) a first resistor coupled between the circuit node and a drain terminal of the first transistor, and
(d) a second resistor coupled between the circuit node and a source terminal of the first transistor,
wherein the biasing circuit includes:
a current source coupled to the circuit node, and
a third resistor coupled in parallel with the current source.

7. A driver circuit, comprising:
a first metal oxide semiconductor (MOS) transistor; and
a first passive biasing circuit coupled to a gate terminal of a first MOS transistor, the first passive biasing circuit including,
(a) a biasing circuit coupled to a circuit node to provide a first biasing signal to the gate terminal of the first MOS transistor, wherein the biasing circuit includes a current source coupled to the circuit node, and a third resistor coupled in parallel with the current source,
(b) a first capacitor coupled between the circuit node and a power supply conductor,
(c) a first resistor coupled between the circuit node and a drain terminal of the first MOS transistor, and
(d) a second resistor coupled between the circuit node and a source terminal of the first MOS transistor.

8. The driver circuit of claim 7, further including:
a second MOS transistor of a same conductivity type as the first transistor and coupled in a cascode arrangement with the first MOS transistor; and
a second passive biasing circuit providing a second biasing signal to a gate terminal of the second MOS transistor.

9. The driver circuit of claim 7, wherein the biasing circuit further includes:
a voltage source; and
a third resistor coupled between the voltage source and the circuit node.

10. The driver circuit of claim 7, further including a second MOS transistor in a cascode arrangement with the first MOS transistor and including a gate terminal coupled for receiving a data signal.

11. A method of making a driver circuit, comprising:
providing a plurality of transistors of a same conductivity type coupled in a cascode arrangement; and
providing a first passive biasing circuit coupled to a gate terminal of a first transistor of the plurality of transistors, the first passive biasing circuit including,
(a) a biasing circuit coupled to a circuit node to provide a first biasing signal to the gate terminal of the first transistor,
(b) a first capacitor coupled between the circuit node and a power supply conductor,
(c) a first resistor coupled between the circuit node and a drain terminal of the first transistor, and
(d) a second resistor coupled between the circuit node and a source terminal of the first transistor.

12. The method of claim 11, further including:
providing a second passive biasing cell for producing a second biasing signal; and
providing a second transistor of the plurality of transistors comprising a gate terminal coupled for receiving the second biasing signal.

13. The method of claim 11, wherein the biasing circuit includes:
a voltage source; and
a third resistor coupled between the voltage source and the circuit node.

14. The method of claim 11, wherein the biasing circuit includes:
a current source coupled to the circuit node; and
a third resistor coupled in parallel with the current source.

15. The method of claim 11, further including a second transistor of the plurality of transistors comprising a gate terminal coupled for receiving a data signal.

16. The method of claim 11, further including a second transistor of the plurality of transistors comprising a gate terminal coupled for receiving a second biasing signal.

17. The method of claim 11, further including providing a laser diode coupled to an output of the driver circuit.

* * * * *